(12) United States Patent
Nemoto et al.

(10) Patent No.: US 6,407,432 B1
(45) Date of Patent: Jun. 18, 2002

(54) SEMICONDUCTOR DEVICE

(75) Inventors: Minehiro Nemoto; Yasuyuki Kojima; Nobuyasu Kanekawa, all of Hitachi; Seigou Yukutake, Hitachinaka; Katsuhiro Furukawa, Oume, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/446,846

(22) PCT Filed: May 31, 1999

(86) PCT No.: PCT/JP99/02913
§ 371 (c)(1),
(2), (4) Date: Dec. 29, 1999

(87) PCT Pub. No.: WO99/66557
PCT Pub. Date: Dec. 23, 1999

(30) Foreign Application Priority Data

Jun. 18, 1998 (JP) ............................................. 10-170740

(51) Int. Cl.[7] .......................... H01L 27/01; H01L 27/12; H01L 31/0392
(52) U.S. Cl. ........................ 257/354; 257/355; 257/356; 257/365; 257/668; 257/510; 257/532; 379/412; 379/399
(58) Field of Search ................................. 257/354, 355, 257/356, 365, 668, 510, 532; 379/412, 399

(56) References Cited

U.S. PATENT DOCUMENTS 5,932,923 A * 8/1999 Kim et al. .................. 257/667

FOREIGN PATENT DOCUMENTS

JP 409232622 A * 9/1997

* cited by examiner

Primary Examiner—David L. Talbott
Assistant Examiner—Luan Thai
(74) Attorney, Agent, or Firm—Antonelli, Terry, Stout & Kraus, LLP

(57) ABSTRACT

A small sized semiconductor device having a high insulating performance between a primary side circuit and a secondary side circuit is realized. A circuit region 2, plural first and second terminal electrodes 5 connected to the circuit region 3, and an insulation-separation region 4 for separating electrically the first terminal electrodes from the second terminal electrodes, and for transmitting signals between the first and the second terminal electrodes are formed onto a semiconductor chip 1, and the insulation-separation region 4 is provided between the first and second terminal electrodes. The interval between the first and the second terminal electrodes on the same semiconductor chip can be separated with high insulating performance.

10 Claims, 10 Drawing Sheets

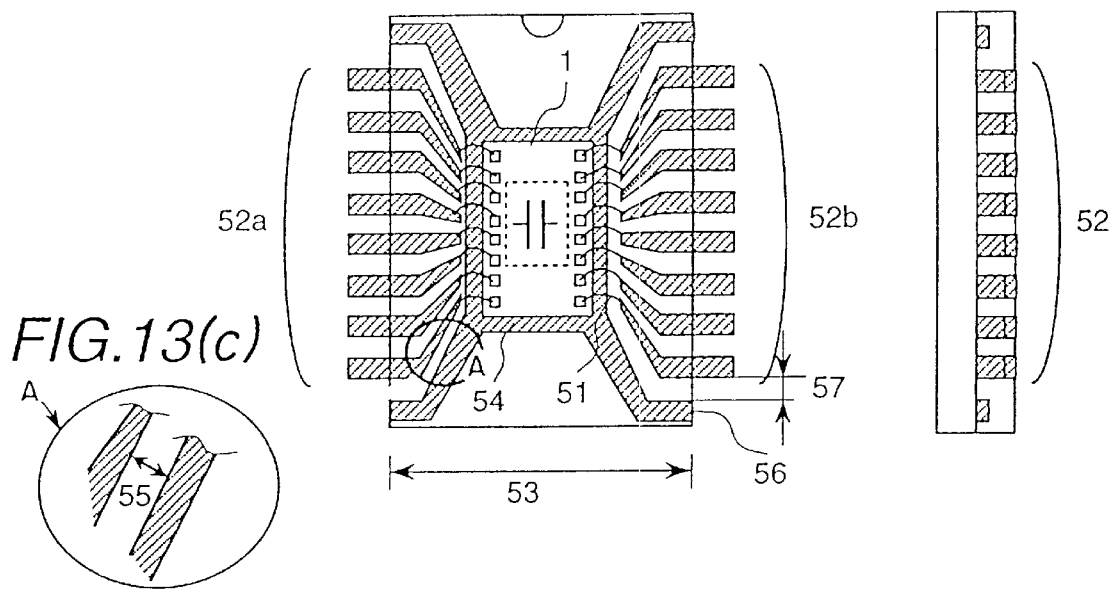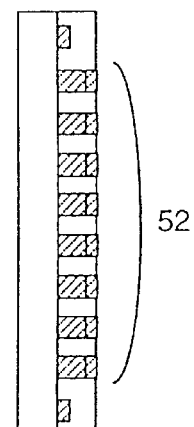
FIG.13(a)   FIG.13(b)   FIG.13(c)
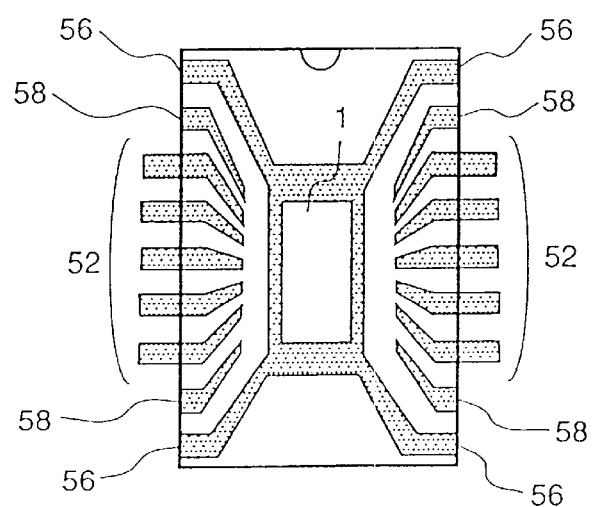
FIG.14

SEMICONDUCTOR DEVICE

TECHNICAL FIELD

The present invention relates to a semiconductor device, including any of an insulating coupler for insulating and separating circuit regions and for transmitting electrical signals, an isolator using the same, and an application circuit using the isolator wherein terminals are insulated and separated.

BACKGROUND OF THE INVENTION

In a case when plural circuits should be insulated electrically for ensuring safety and for decreasing noises and the like (in a case when a primary circuit and a secondary circuit should be insulated), an individual member, such as a transformer, photo-coupler, and the like, has been used conventionally. These members are referred to generally an insulating coupler, or an isolator. For instance, in the field of communication, high insulating performance is required at boundaries between networks and terminals for protecting the network facilities and the terminal devices having high public interests. In order to ensure a high insulating performance, isolators such as small size transformers for communication, and the like have been used. In the field of instrumentation, medical application, and the like, a sensor portion, a signal detecting portion such as signal waveform processing circuit, and a signal processing portion must be separated in order to ensure the safety and anti-noise protection of the human body and the measuring apparatus, the isolator has been used as an insulating and separating means.

When a transformer is used for insulation, decreasing its size has been restricted in comparison with other individual members, because of a restriction in materials and structure used for the transformer. Accordingly, sometimes requirements for portable terminal devices and card type interfaces, which have been developed rapidly in recent years, could not be satisfied sufficiently. In comparison with other individual devices, such as transistors and resistors, the transformer was expensive, and if special material was used for decreasing its size, its price was further increased.

In order to solve the foregoing problems, such as decreasing the size, weight, and price, an isolator using a photo-coupler, which was assembled with a combination of a light emitting element and light receiving element, was invented. However, in the case of a photo-coupler type isolator, the electric characteristics are readily varied depending on external characteristics, such as temperature change, on account of the structural feature of the element, and, if the variation is to be corrected, a correcting circuit, which required precise control, was necessary. In addition to general manufacturing processes for producing the semiconductor device, an extra manufacturing process for producing the light emitting element and the light-receiving element is required. Accordingly, the isolator was generally expensive, and it was difficult to manufacture the light emitting element and the light receiving element simultaneously with the semiconductor device, such as a driving, detecting, correcting circuit, and others.

A capacitive isolator has been developed, in order to decrease the size and price of the isolator. Ceramic capacitors for power or for protecting against surge have been used as individual members for composing an insulating barrier, and a circuit for transmitting signals composed of the above members is called a capacitive insulating amplifier, or a capacitive insulating coupler. A PWM (Pulse Width Modulation) method and others are generally used as the method of transmitting signals via the capacitive insulating barrier, but this method has been applied to the isolator using the insulating transformer and photo-coupler, before this method is applied to the capacitive insulating coupler and the like.

With respect to circuit interface application, such as a modem and the like, U.S. Pat. No. 4,757,528 (hereinafter, called the 528 patent) discloses an idea of making a monolithic semiconductor using a capacitive insulating barrier. JP-A-7-30770 (1995) discloses three capacitive insulating barriers, although they are not monolithic, and a modem application circuit method for digital PWM signal transmission using the same.

The isolator is required further to be decreased in size, weight, and price. In view of these points, the prior art has the following issues and problems.

In accordance with the prior art before the 528 patent, an insulating barrier having a high performance in dielectric withstand voltage includes a signal modulating circuit portion for converting input signals to waveform suitable for transmission and a signal demodulating circuit portion for demodulating the received transmitted signals to the original signals provided as respectively separated components, and the isolator was composed of the plural components mounted on a same package, and the like. Accordingly, the number of the components is large, the assembling steps are complex, and a problem is generated in decreasing its production cost. Because of the need to mold a large number of components into a single package, a problem was generated in decreasing its size.

In accordance with the 528 patent, concurrent use of the capacitive insulating barrier and the PWM transmission method is disclosed as a means for composing the circuit interface, which is an application circuit using a monolithic semiconductor. In accordance with the above manufacturing method, the insulating coupler comprising the capacitive insulating barrier and the PWM circuit is formed on a monolithic semiconductor by a dielectric separating process, and signals in voice band are transmitted. However, the disclosed technology only relates to control of an insulating switch by thermal pulses, and the 528 patent is silent as to what structures of the insulating barrier and the control circuit are used, by what method they are composed, how it operates as a result, and what advantages can be realized.

In accordance with JP-A-7-307708 (1995), a circuit composition, wherein three signals are transmitted by three capacitive insulating barriers, is disclosed, in contrast with using two insulating barriers for one transmission path, conventionally. However, how to operate it for transmitting signals is not indicated. No suggestion for providing a monolithic semiconductor with these circuits including the insulating barriers is proposed.

In case of an isolator of the prior art using transformer and photo-coupler, the ability to reduce its size and price as requested by the market was restricted, on account of the large number of components involved in the mounting operation and the structures of the components themselves. An isolator using a capacitive insulating barrier, which was expected to decrease in size in comparison with the isolator and the like using a transformer, was proposed. However, the capacitive barrier and its transmitting circuit were individual components, and so a decrease in the size was restricted. In a case when these members are composed of multi-chip modules, a problem that the module is expensive was generated.

An idea to compose the peripheral circuits and the capacitive barrier in a monolithic semiconductor structure has been disclosed. However, no practical structure of the capacitive barrier is disclosed, nor is any circuit and its arrangement for using the capacitive barrier disclosed. Accordingly, no practical method and composition are disclosed, nor is any practical technology for realizing a smaller size and a cheaper price disclosed.

The present invention was achieved in consideration of the above problems. The present invention provides insulating barriers having a smaller size and a cheaper price, and having a high insulating performance, and a monolithic isolator IC and application circuit IC, using the insulating barrier.

The present invention provides a method for composing the insulating barrier and its control circuit and peripheral circuits on a semiconductor chip, in which a high dielectric withstand voltage performance between insulated and separated regions is achieved.

The present invention provides design technology for realizing a high dielectric withstand voltage performance, when a semiconductor device composed of monolithic isolator is mounted on an IC package.

SUMMARY OF THE INVENTION

The semiconductor device in accordance with the present, invention comprises a semiconductor chip, which comprises a circuit region; a plurality of first terminal electrodes and a plurality of second terminal electrodes, which are connected to the circuit region, respectively; and an insulation region separating electrically the plurality of first terminal electrodes from the plurality of second terminal electrodes, for transmitting signals from a first terminal electrode to a second terminal electrode. Therefore, the semiconductor device becomes small in size, even though it has a preferable insulating performance. Here, by using the semiconductor device according to the present invention with a SOI (Silicon on Insulator) substrate, or dielectric separating substrate, and an insulating groove by trench technology, plural circuit regions are isolated and separated electrically from each other. As a signal transmitting means among the circuit regions, any of a high dielectric withstand voltage capacitance utilizing the insulating groove, a high dielectric withstand voltage capacitance utilizing insulating film between layers, a transformer utilizing the circuit and the insulating film between layers, and the like is used.

When the semiconductor device according to the present invention is practically composed, important points for realizing a decrease in size and price, and a high dielectric withstand voltage performance, are as follows:

(1) In a chip layout of the semiconductor device, wherein insulated and separated plural circuit regions and isolators are made monolithic, the supporting substrate portion of the semiconductor device and the circuit regions are insulated and separated so that the required dielectric withstand voltage at all portions of the semiconductor device can be obtained, in addition to the isolation-separation between the circuit regions.

(2) The areas occupied by respective ones of the insulated and separated circuit regions in the above chip layout of the semiconductor device are designed to be equal to each other, in order to share the voltage equally even if a high voltage is applied between the circuit regions.

(3) When the areas occupied by respective ones of the insulated and separated circuit regions in the above chip layout of the semiconductor device are not equal to each other, an unevenly shared voltage generated when a high voltage is applied between the circuit regions is solved by altering the composition of the insulating grooves for separating the circuits corresponding to the area of the circuit. Furthermore, a region surrounded with the insulating grooves, where electricity is not applied, is provided in the circuit region; an electricity applied region for adjustment is newly provided outside the circuit region; or an external capacitance is connected to the outside of the semiconductor device. Otherwise, the problem of the unevenly shared voltage is solved by concurrent use of the above measures.

(4) In accordance with the above-described chip layout of the semiconductor device, the distance between terminal electrodes requiring a high dielectric withstand voltage among the terminals, the insulating film of which has peeled off, is selected to be a value which does not cause any dielectric breakdown. That is, the layout is designed to obtain the necessary dielectric withstand voltage outside the semiconductor device, in addition to inside the semiconductor device.

(5) In accordance with the above-described semiconductor device, the distance between a bonding wire for electrically connecting the terminal electrode and a lead used in mounting the device in a package, and a part of the semiconductor device (such as openings of a bonding pad, terminal end portions of the semiconductor chip, and others), the insulating film of which has peeled off, is selected to be a value which does not cause any dielectric breakdown.

(6) In accordance with the package whereon the above-described semiconductor device is mounted, the distance between leads requiring insulation and separation from each other is selected to be a value which does not cause any dielectric breakdown. Practically, the distance between inner leads requiring insulation and separation from each other, the distance between the inner lead and the die pad mounted with the semiconductor device, and the distance between outer leads withdrawn from the package each are selected to be a value which does not cause any dielectric breakdown. Naturally, the end portions are designed to have a higher dielectric withstand voltage than the dielectric withstand voltage for the inside of the semiconductor, in order to utilize the performance of the device sufficiently.

In accordance with the present invention, it becomes possible for the first time to provide a semiconductor device, wherein plural circuit regions and isolators insulated and separated are made monolithic, in a condition that the semiconductor device is mounted on an IC package and the like, and is practically usable. By applying the semiconductor devices according to the present invention to modem circuits and terminal devices incorporating the modem circuits therein in the field of communication, these circuits and devices can be decreased in size. The semiconductor device according to the present invention can be applied not only to the field of communication, but also to the field of instrumentation and medical use. For instance, if it is used for insulation, and separation between various sensors and signal processing circuits, the anti-noise property and safety for the human being can be improved.

BRIEF DESCRIPTION ON DRAWINGS

FIG. 13(a) is a plan view of an embodiment of the semiconductor device according to the present invention when assembled into a package;

FIG. 13(b) is a side view thereof, and

FIG. 13(c) is a detailed view of the area A in FIG. 13(a).

FIG. 14 is a plan view of one other embodiment of the semiconductor device according to the present invention for assembly into a package.

PREFERRED EMBODIMENT OF THE PRESENT INVENTION

Figure 1:
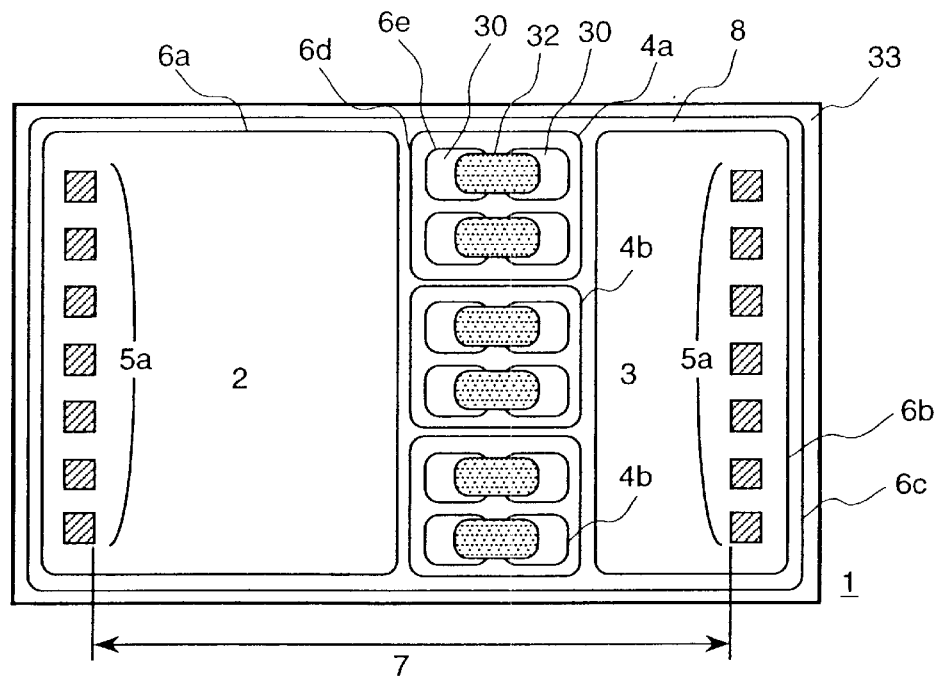
FIG. 1 is a schematic diagram illustrating indicating an embodiment of the semiconductor device according to the present invention.

FIG. 1 is a schematic drawing illustrating a structure of the semiconductor device, which represents an embodiment of the present invention. The semiconductor device is composed of a semiconductor chip 1, which comprises roughly a primary circuit region 2, a secondary circuit region 3, and an isolator region 4 insulating and separating electrically the above circuit regions. Each of the above regions is formed on a single crystal semiconductor region of the semiconductor chip, but respective ones of the semiconductor regions are separated electrically from each other by an insulating groove 6 using an insulator, such as silicon oxide and the like. In accordance with FIG. 1, the primary circuit region 2 is surrounded by the insulating groove 6a, and the secondary circuit region 3 is surrounded by the insulating groove 6b. The isolator region 4 is surrounded by the insulating groove 6d. An isolator is composed of two flat plate type high dielectric withstand voltage capacitors, each of which is composed of a wiring 32, an interlayer insulating film, and a semiconductor region 30. In the present embodiment, a total of three isolators are mounted. By surrounding the primary circuit region 2, the secondary circuit region 3, and the isolator region 4 with the insulator 6c, the semiconductor region 8 surrounding each of the regions and the outermost silicon region 33 of the semiconductor chip, which is peeled off by dicing, are insulated and separated from each other.

In the figure, the insulator separating the respective regions is indicated as a groove, but in a case when a high dielectric withstand voltage is required, the insulator is composed of plural insulating grooves. In accordance with the present embodiment, a necessary insulating and separating withstand voltage between the primary circuit region 2 and the secondary circuit region 3 is 3000 V. The dielectric withstand voltage per one separating groove is 100 V. Therefore, the primary circuit region 2 is surrounded with 15 insulating grooves 6a for achieving a dielectric withstand voltage of 1500 V, the secondary circuit region 3 is surrounded with 15 insulating grooves 6b for achieving a dielectric withstand voltage of 1500 V, the isolator region 4 is surrounded with 15 insulating grooves 6d for achieving a dielectric withstand voltage of 1500 V, and, accordingly, a dielectric withstand voltage of 3000 V can be obtained for boundaries between the respective regions. On the other hand, the insulating groove 6e surrounding the high dielectric withstand voltage capacitors which make up the isolator 4 is necessary for separating electrically the capacitor portions from the surroundings, and one or two insulating grooves 6e are sufficient. For instance, in a circuit region, a latch up phenomenon of a CMOS composed of n-type MOSFET and p-type MOSFET can be prevented by surrounding a region occupied by the n-type MOSFET with an insulating groove. As indicated above in the present embodiment, the number of the insulating grooves 6 surrounding the regions are varied depending on whether the portion requires a high insulating and separating dielectric withstand voltage, or the portion requires a relatively low insulating and separating dielectric withstand voltage.

As a semiconductor substrate for forming such a semiconductor chip, one of a dielectric separation substrate and SOI (silicon on insulator) substrate is used, because of the need for obtaining a high insulation dielectric withstand voltage.

In the semiconductor chip 1, the primary circuit region 2 and the secondary circuit region 3 are certainly separated electrically, because they are arranged so as to have the isolator region 4 interposed between them. However, signals are transmitted between the primary circuit region and the secondary circuit region through the isolator region 4. A plurality of bonding pads 5, which are terminal electrodes for input and output of the signals, are provided in respective circuit regions at the primary circuit region 2 side and the secondary circuit region 3 side. Although not shown in the figure, respective bonding pads at the primary circuit region 2 side and the secondary circuit region 3 side are connected to the primary circuit region 2 and the secondary circuit region 3, respectively. Accordingly, the bonding pad 5a at the primary circuit region 2 side is insulated and separated electrically from the bonding pad 5b at the secondary circuit region 3 side by the isolator region 4, but the signals are transmitted through the isolator region 4. The bonding pads 5 are arranged along two opposed sides of the rectangular shape at the peripheral portion of the rectangular semiconductor chip 1. Therefore, the bonding pads 5a at the primary circuit region 2 side are arranged on the semiconductor chip so as to be separated from the bonding pads 5b at the secondary circuit region 3 side, with the isolator region 4, the primary circuit region 2, and the secondary circuit region 3 interposed between them. Accordingly, a necessary dielectric withstand voltage can be obtained between the bonding pads at the primary circuit region 2 and the bonding pads at the secondary circuit region 3. The distance 7 between the bonding pads 5a at the primary circuit region 2 side and the bonding pads 5b at the secondary circuit region 3 side is set so that no dielectric breakdown occurs between the bonding pads 5a at the primary circuit region 2 side and the bonding pads 5b at the secondary circuit region 3 side with a voltage smaller than the dielectric withstand voltage of the isolator region 4. Because the dielectric breakdown voltage is not determined by the dielectric withstand voltage of the insulator of the semiconductor device, but by the environment (for instance, molding material, atmosphere, and the like), the bonding pad portion 5 is the only portion on which the insulating and separating body is peeled off in respective circuit regions.

As explained above, the feature of the present invention is in accumulating plural circuit regions, which are insulated and separated from each other in a semiconductor chip, and in the isolators, which maintain the insulation and separation between the circuit regions and transmit only signals. As a result, in accordance with the present embodiment, the semiconductor device having a high insulation property among the circuit regions can be decreased in size. Accordingly, decreasing the size and lowering the price of the isolator can be realized.

Figure 2:
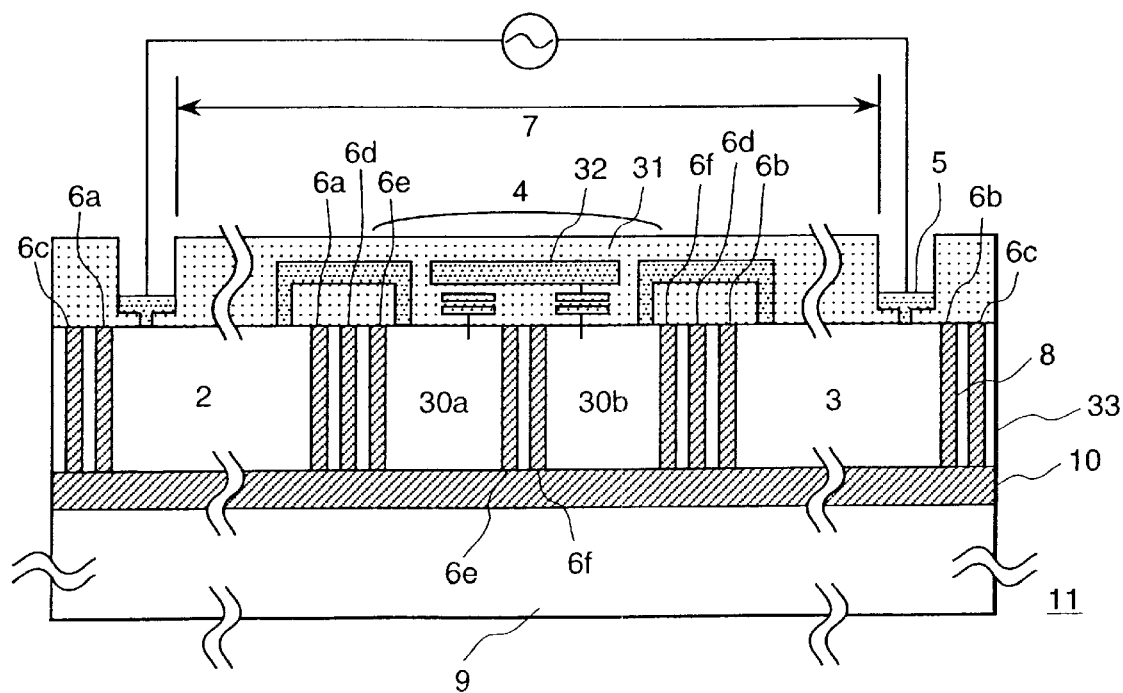
FIG. 2 is a schematic cross section showing an embodiment of the semiconductor device according to the present invention.

FIG. 2 is a schematic illustration showing a cross sectional structure of the embodiment shown in FIG. 1. The present embodiment is an example using a SOI substrate 11. The present embodiment comprises the supporting substrate 9, the buried insulating layer 10, the circuit region 2, 3, insulating groove 6, the circuit region for isolator 30, interlayer insulating film 31, wiring 32, and others. Device groups in respective circuit regions are omitted in the figure. The primary circuit region 2 is separated electrically from the other regions by the buried insulating layer of the SOI substrate 10, the insulating groove 6a filled with an insulator, and the interlayer insulating film 31. Similarly, the secondary circuit region 3 is separated electrically from other regions by the buried insulating layer of the SOI substrate 10, the insulating-groove 6b filled with an insulator, and the interlayer insulating film 31. The isolator 4 for insulating and separating circuit regions electrically, and transmitting signals, is composed of a first portion formed by the flat plate type high dielectric withstand voltage capacitor 13 comprising the interlayer insulating film 31 and wiring 32, the semiconductor region for isolator 30a, and the insulating groove 6e surrounding the semiconductor region for the isolator; and a second portion formed by the flat plate type high dielectric withstand voltage capacitor 13 comprising the interlayer insulating film 31 and wiring 32, the semiconductor region for the isolator 30b, and the insulating groove 6f surrounding the semiconductor region for the isolator; by connecting the two portions in series, and further surrounding them with the insulating groove 6d. In accordance with the structure in which respective circuit regions are surrounded by the buried insulating layer 10, the insulating groove 6, and the interlayer insulating film 31, electrical insulation between respective circuit regions can be maintained, even if a high voltage is applied between the primary circuit region 2 and the secondary circuit region 3. As described previously relating to FIG. 1, when a high insulating and separating withstand voltage is necessary, the insulating groove for separating respective regions is sometimes composed of plural grooves. In accordance with FIG. 2, each insulating groove is indicated by a single line. However, if the necessary insulating and separating withstand voltage between respective regions is 3000 V, and the dielectric withstand voltage per one separating groove is 100 V, each insulating groove 6a surrounding the primary side circuit region, the insulating groove 6b surrounding the secondary side circuit region, and the insulating groove 6d surrounding the isolator is composed of 15 insulating grooves.

Here, it is considered that, if a high voltage is applied to the primary circuit region and the secondary circuit region, what potential does the respective regions have. When a high voltage is applied between the primary side circuit region and the secondary side circuit region, the potential at the supporting substrate 9 becomes approximately a half of the applied voltage, because the supporting substrate is located at an intermediate position between the primary side circuit region 2 and the secondary side circuit region 3 interposing the buried insulating layer 10. Similarly, the potential at the semiconductor region 8 between the insulating groove 6a surrounding the primary side circuit region 2 and the insulating groove 6b surrounding the secondary side circuit region 3 becomes approximately a half of the applied voltage. The potential at the supporting substrate 9 and the potential at the outermost peripheral silicon region 33 at the surface of the chip are reasonably regarded as equal, because, when the semiconductor chip is diced, the end planes of the chip become uncovered, and generation of a short-circuit between the supporting substrate 9 and the outermost peripheral silicon region 33 can be assumed to occur. When the floating capacitance of the circuit regions differ from each other, the potential at the outermost peripheral silicon region 33 and the potential at the semiconductor regions 8 between respective circuit regions differ from each other. Therefore, the semiconductor regions 8 at the outer peripheral portion of the respective circuit regions and the outermost peripheral silicon region 33 of the chip is insulated and separated by the insulating groove 6c.

As described above, when a voltage is applied between the primary side and the secondary side of the circuit regions, not only the isolator 12, but also all the portions of the semiconductor device share the voltage. Accordingly, the generation of a dielectric breakdown with a lower voltage than the designed dielectric withstand voltage must be prevented at all of the portions of the semiconductor device. Furthermore, because the bonding pad portion 5 connected electrically to the respective circuit regions is the only portion which is uncovered from the insulation and separation body among the insulated and separated circuit regions, it is necessary to set the distance 7, so as to prevent the bonding pad portion 5 from generating a dielectric breakdown with a lower voltage than the dielectric withstand voltage inside the semiconductor region. That means, consideration is necessary for preventing the semiconductor device from generating a dielectric breakdown with a lower voltage than the designed dielectric withstand voltage not only inside, but also outside, of the semiconductor region.

As explained above, in accordance with the present embodiment, a monolithic semiconductor device with plural circuit regions and isolators having a high insulating property and a reduced size can be obtained. Because the semiconductor device of the present embodiment can be manufactured by a regular production process, which does not include any special semiconductor manufacturing process steps nor LSI assembling process steps, a reduction in its price can be realized.

Figure 3:
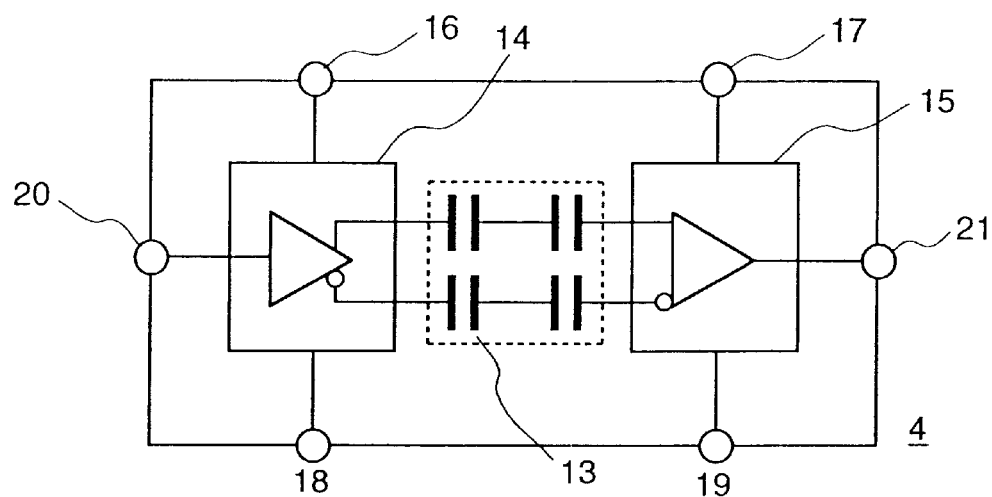
FIG. 3 is a schematic circuit diagram of an embodiment of the isolator incorporated in the semiconductor device according to the present invention.

FIG. 3 is a drawing indicating schematically an example of the circuit composition of the capacitive isolator incorporated in the semiconductor device of the present invention. Referring to this drawing, a transmitting system of the isolator will be explained briefly.

The isolator 4 is composed of a driver portion 14, a transmitting portion comprising a total of four high dielectric withstand voltage capacitors 13, two of which are connected in series, two transmitting paths being formed by the connected capacitors, and a receiver portion 15. Each of the driver circuit 14 and the receiver portion 15 are provided with power supply terminals 16, 17 for connection to an independent power source, and ground terminals 18, 19, because they are insulated electrically from each other. The signals for transmission are input via the input terminal 20 of the driver portion 14, and are converted by the driver circuit into two complementary signal waveforms for driving one of the side terminals of the capacitor 13. The signal transmitted through the capacitor 13 is detected by the receiver portion 15 and is demodulated to the same signal as the input waveform. In accordance with the circuit arrangement described above, only the signal component can be transmitted to the output side, realizing high insulating characteristics between the input and the output. In accordance with the present embodiment, a pulse transmittance system was used, but other prior art techniques can be used.

Figure 4:
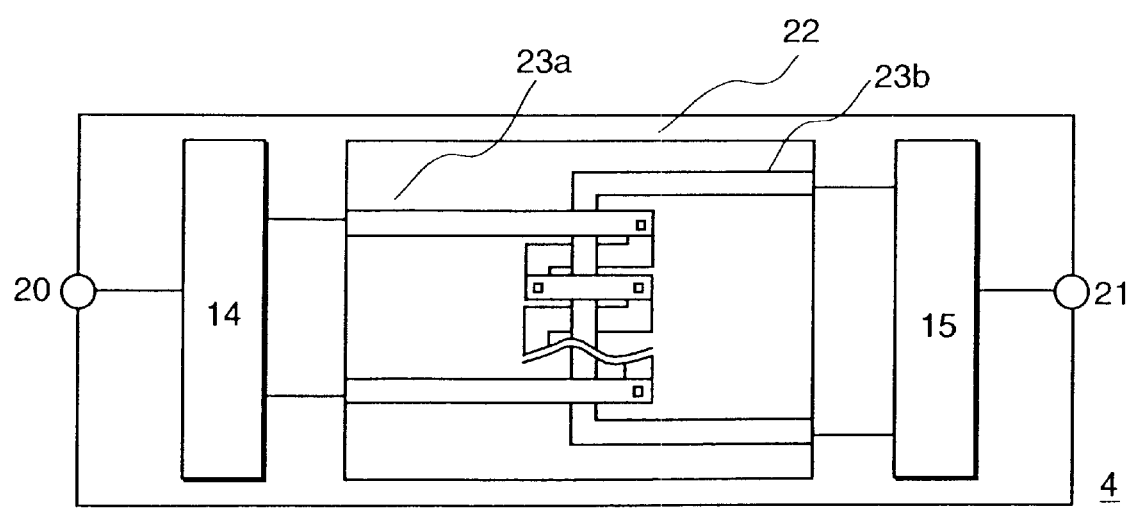
FIG. 4 is a diagram of the isolator incorporated in the semiconductor device according to the present invention.

The embodiment shown in FIG. 4 is an example, wherein a transformer 22, instead of the capacitor 13, has been formed on the semiconductor chip. The isolator region 4 in the present embodiment is composed of the signal modulating circuit 14, the transformer 22, and the signal demodulating circuit 15. The transformer 22 is formed using plural wiring 23 and multi-layered wiring technology of a semiconductor device. Hitherto, the capacitive isolator using a high dielectric withstand voltage capacitor has been used for explanation. However, the isolator is not restricted to use of a capacitor as indicated in the present embodiment, but any isolator can be used if it is formed on the same semiconductor chip and it has the same effect as an isolator using a capacitor.

Figure 5:
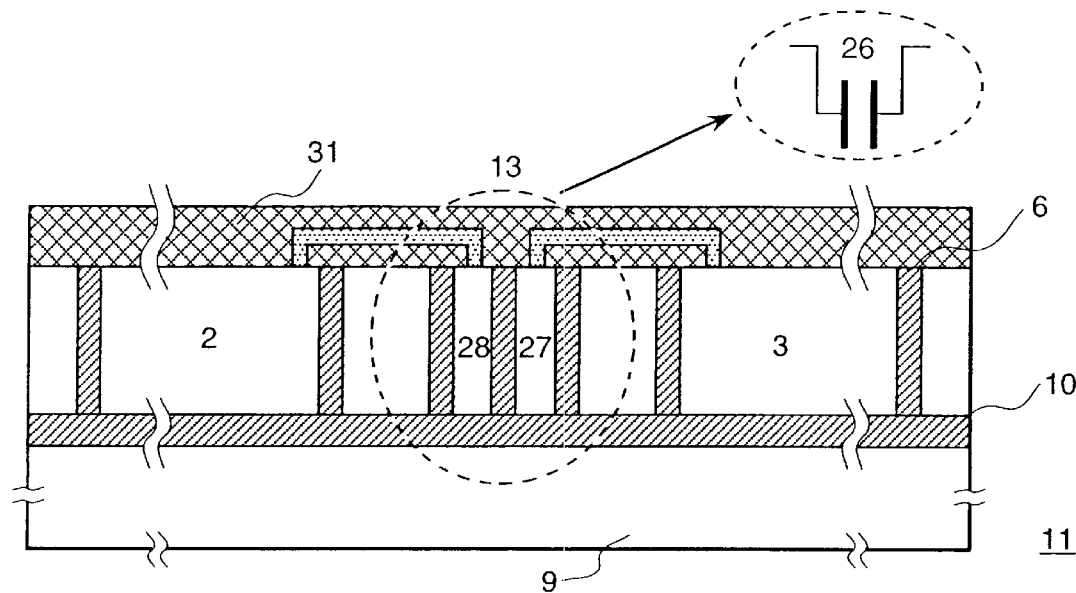
FIG. 5 is a schematic cross-section an embodiment of a capacitor used for the isolator.

FIG. 5 shows an embodiment, wherein the capacitor used for the capacitive isolator is formed in the semiconductor device. The SOI substrate 11 is composed of the supporting substrate 9, the buried insulating layer 10, and the insulating groove 6. The primary side circuit region 2, the capacitor 13, and the secondary side circuit region 3 are separated from each other by the insulating groove 6. The high dielectric withstand voltage capacitor 26 according to the present embodiment is composed of the semiconductor region 27, the semiconductor region 28, and the insulating groove on the SOI substrate for insulating and separating the primary side circuit and the secondary side circuit. That is, the insulating groove 6 is used as a dielectric body of the capacitor. The high dielectric withstand voltage capacitor 26 composed as explained above is connected to the insulated and separated circuit regions 2, 3, via the modulation-demodulation circuits for signals, and wiring. When the capacitor is, formed using the insulating groove as explained above, no additional manufacturing step for manufacturing the high dielectric withstand voltage capacitor is necessary. Furthermore, the manufacturing steps for forming the SOI substrate and forming the insulating groove on the SOI substrate are also general semiconductor manufacturing processes typically used for current LSI and power IC. In accordance with the present embodiment, a high insulating property and decreased size can be realized with no generation of additional manufacturing cost for forming the capacitor.

Figure 6:
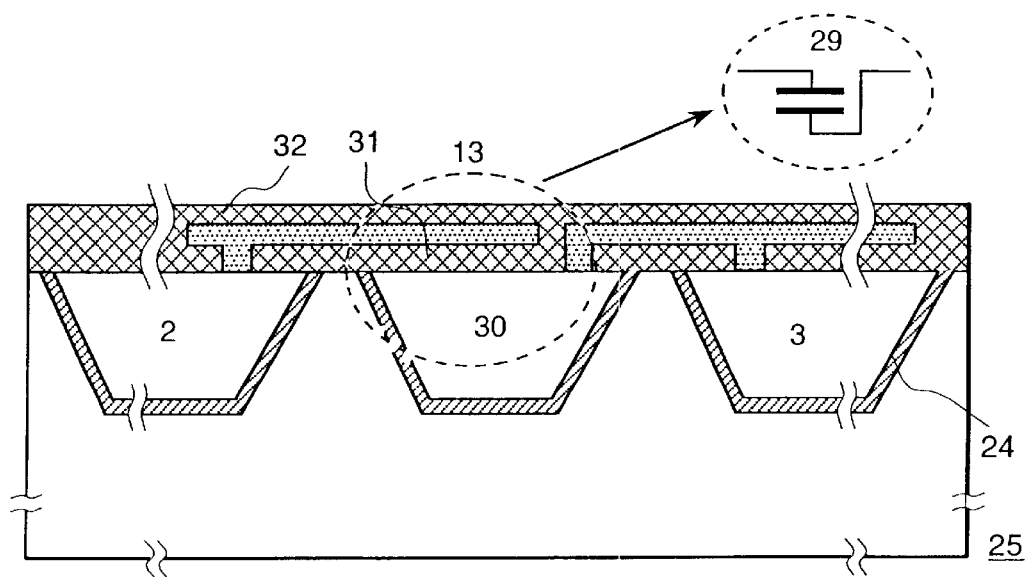
FIG. 6 is a schematic cross-section of another embodiment of the capacitor used for the isolator.

FIG. 6 shows another form of the capacitor used for the capacitive isolator. In accordance with the present embodiment, a dielectric separation substrate 25 is used. However, the SOI substrate explained with reference to FIG. 5 can also be used similarly. The primary side circuit region 2, the capacitor 13, and the secondary side circuit region 3 are insulated and separated from each other by the insulating-separating film 24. The flat plate type high dielectric withstand voltage capacitor 29 according to the present embodiment is composed of the semiconductor region 30, an interlayer insulating film 31 of LSI multilayered wiring, and wiring 32. Accordingly, in the case of the present embodiment, no additional manufacturing step for manufacturing the high dielectric withstand voltage capacitor 29 is necessary at all.

The manufacturing step used to form the flat plate type high dielectric withstand voltage capacitor 29 is quite irrelevant to the manufacturing steps of the dielectric separation substrate 25 for insulating and separating the primary side circuit region 2 and the secondary side circuit region 3, and the SOI substrate 11. Therefore, any kind of substrate can be used. When a high dielectric withstand voltage is required, the capacitor using a trench structure increases in the area of the isolator region, because an increase in the insulating groove causes an increase in the region for insulation and separation. However, the flat plate type high dielectric withstand voltage capacitor can increase the dielectric withstand voltage by increasing the thickness of the interlayer insulating film. Therefore, when a high dielectric withstand voltage is required, a decrease in size and a reduction in cost can be more readily realized by the flat plate type capacitor, in comparison with the case of a capacitor using the trench structure as indicated in FIG. 5.

Figure 7:
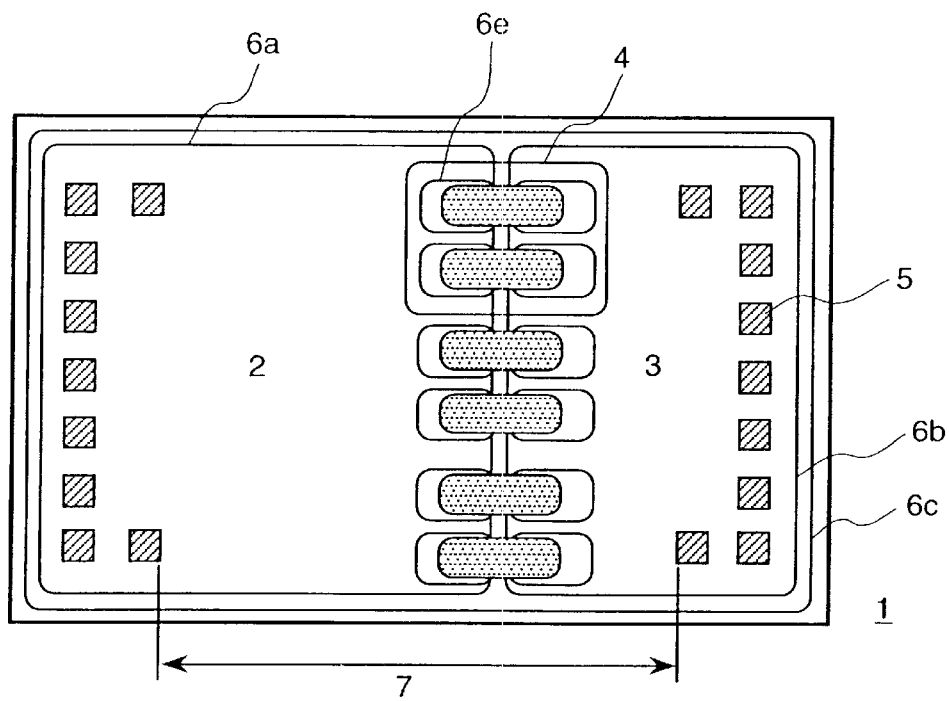
FIG. 7 is a schematic diagram illustrating one other embodiment of the semiconductor device according to the present invention.

FIG. 7 illustrates schematically the structure of a semiconductor device representing another embodiment of the present invention. The semiconductor device comprises a semiconductor chip, which is composed of a roughly divided primary side circuit region 2 and secondary side circuit region 3. The difference from the structure indicated in FIG. 1 is in the fact that the circuit 25 of the isolator 4 is divided into a primary circuit side and a secondary circuit side in the insulated and separated circuit regions 2, 3, and the isolator regions are arranged in the primary side circuit region 2 and the secondary side circuit region 3. In accordance with this composition, the area occupied by the insulating-separating region surrounding the isolator can be decreased, because the portions requiring high dielectric withstand voltage insulation and separation can be made common to the insulating-separating portion of the circuit regions. Accordingly, when the area occupied by the insulating groove is increased by increasing the dielectric withstand voltage, the present embodiment is effective in decreasing the chip area, and effective in decreasing the cost. Furthermore, the terminal electrodes need not be necessarily aligned with each other as indicated in the drawing, if the distance 7 between the terminal electrodes in the primary side circuit region 2 and the terminal electrodes in the secondary side circuit region 3 is set as a sufficient distance for obtaining a required dielectric withstand voltage.

Figure 8:
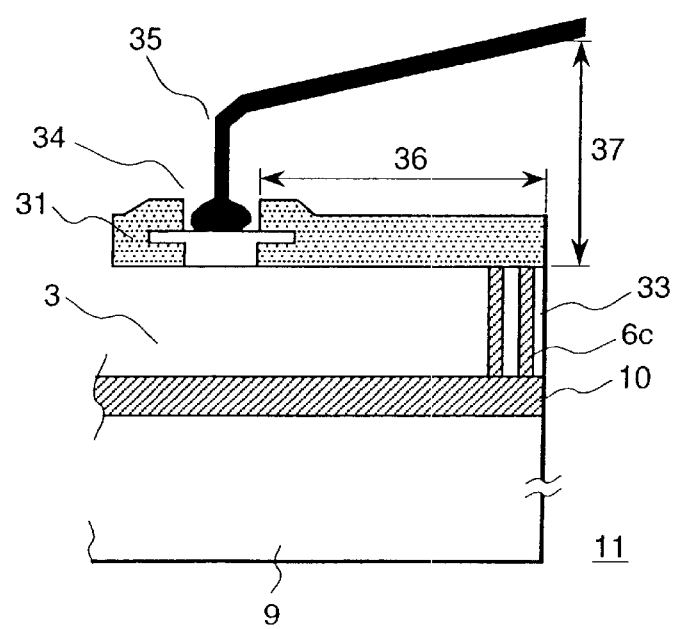
FIG. 8 is a schematic cross section showing an embodiment of the semiconductor device according to the present invention.

FIG. 8 schematically shows a cross section of an end plane of the chip in an embodiment according to the present invention. As explained with reference to FIG. 2, when a high voltage is applied between the primary side circuit region and the secondary side circuit region, the potential at the supporting substrate 9 becomes approximately equal to an intermediate potential between the primary circuit region and the secondary circuit region. The potential at the supporting substrate 9 and the potential at the outermost peripheral silicon region 33 at the surf ace of the chip are reasonably regarded as equal, because, when the semiconductor chip is diced, the end planes of the chip become uncovered, and generation of a short-circuit between the supporting substrate 9 and the outermost peripheral silicon region 33 is considered likely. On the other hand, the bonding pad opening portion 34 is the only portion which is uncovered in the semiconductor region covered with an insulating material. Accordingly, a dielectric withstand voltage of approximately a half of the applied voltage is required between the end portion of the outermost peripheral portion of the silicon region 33 and the bonding pad opening portion 34, and between the end portion of the outermost peripheral portion of the silicon region 33 and the bonding wire 35. The minimum distance 36 between the outermost peripheral portion of the silicon region 33 and the bonding pad opening portion, and the minimum distance 37 between the end portion of the outermost peripheral portion of the silicon region 33 and the bonding wire 35 must be set so that the dielectric withstand voltage, which is based on the electrical characteristics of the molding material covering the chip, becomes higher than the dielectric withstand voltage in the insulating-separating region inside the chip. By setting the distances between the outermost peripheral portion of the silicon region and the bonding pad opening portion, and between the end portion of the outermost peripheral portion of the silicon region and the bonding wire so as to obtain a dielectric withstand-voltage higher than the required dielectric withstand voltage, the need to use a special package or special material for the package, which results in an increase in the cost, can be eliminated.

Figure 9:
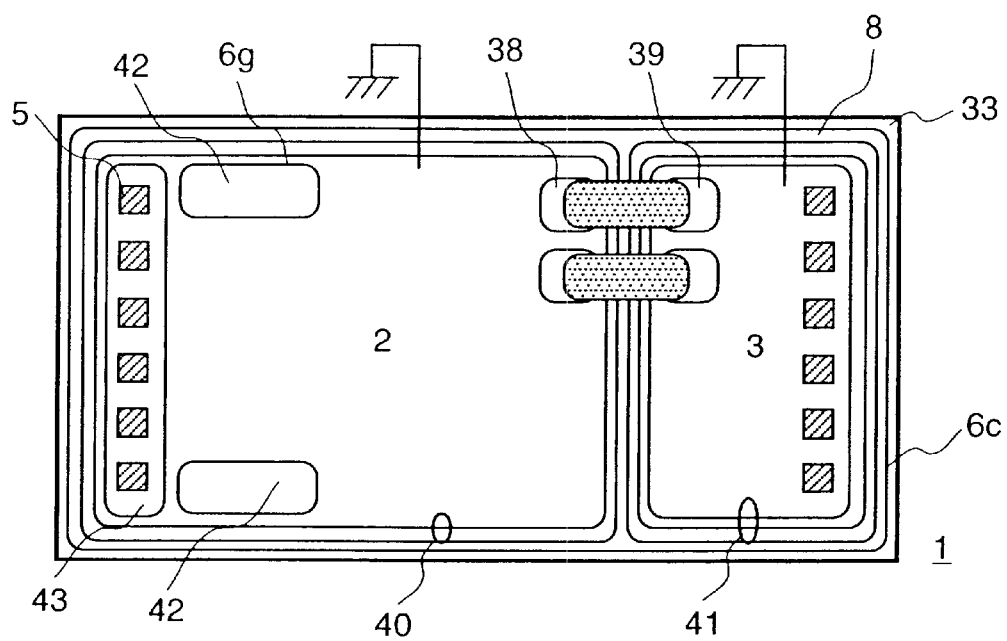
FIG. 9 is a schematic diagram showing one other embodiment of the semiconductor device according to the present invention.

FIG. 9 schematically illustrates the structure of the semiconductor device according to another embodiment of the present invention. The semiconductor device comprises a semiconductor chip, which is composed roughly of a divided primary side circuit region 2 and secondary side circuit region 3. The primary side circuit region, 2 is surrounded with plural insulating grooves 40, and the secondary side circuit region 3 is surrounded with plural insulating grooves 41. In the figure, the grooves are shown in a simplified line, but for instance, in a case when the required dielectric withstand voltage between the primary side circuit region and the secondary side circuit region is 3000 V, and the dielectric withstand voltage per insulating groove is 100 V, the necessary number of the insulating grooves 40 surrounding the primary side circuit region 2 is at least 15, and similarly, the necessary number of the insulating grooves 41 surrounding the secondary side circuit region 3 is also at least 15. In order to insulate and separate the outermost peripheral semiconductor region 33 of the chip, which is likely to produce a short circuit with the supporting substrate of the semiconductor device, from the semiconductor region 8 at the outer side of respective circuit region, the primary side and the secondary side circuit regions are surrounded with the insulating grooves 6c. In accordance with the present figure, the isolator portion, which is a transmitting means, is divided into the primary side circuit 38 and the secondary side circuit 39, and is shown in a simplified form as explained reference to FIG. 7. As shown in the figure, generally, the area occupied by the primary side circuit region 2 sometimes differs from the area occupied by the secondary side circuit region 3.

Figure 10:
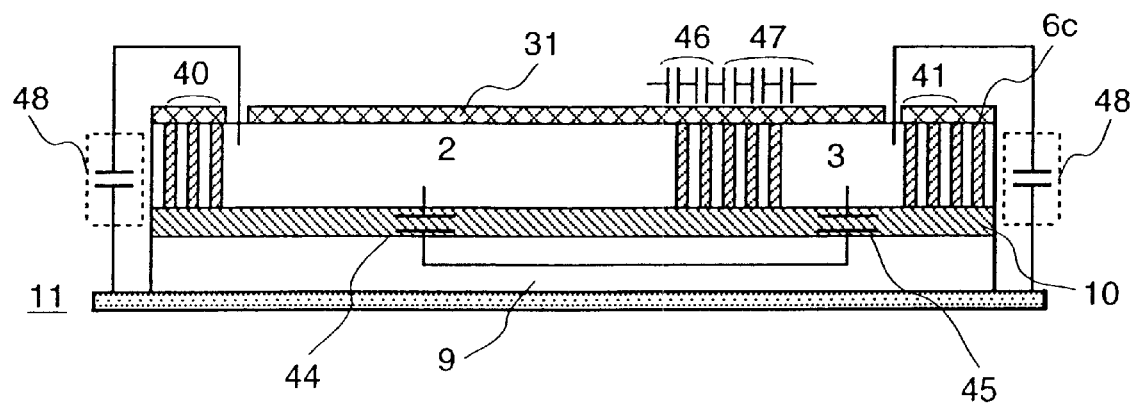
FIG. 10 is a schematic cross section showing an embodiment of the semiconductor device according to the present invention.

FIG. 10 shows a cross section of the structure indicated in FIG. 9. The primary side circuit region 2 and the secondary side circuit region 3 are insulated and separated electrically from other portions, but are connected in a circuit with several parasitic capacitances. For instance, the parasitic capacitance 44 is formed between the primary circuit region 2 and the supporting substrate 9 with the buried insulating layer 10. Similarly, the parasitic capacitance 45 is formed between the secondary circuit region 3 and the supporting substrate 9. At that time, the primary circuit region and the secondary circuit region are connected to each other by the parasitic capacitance 44, 45 and the supporting substrate 9. The parasitic capacitances 46, 47 are formed by the insulating grooves 40, 41, which insulate and separate the primary circuit region and the secondary circuit region, and the primary circuit region and the secondary circuit region are connected to each other. When the areas occupied by each of the circuit regions differ from each other, the capacitance 44 between the primary side circuit region 2 and the supporting substrate 9, and the capacitance 45 between the secondary side circuit region 3 and the supporting substrate 9 differ from each other. The larger the area is, the bigger is the capacitance value. The parasitic capacitance formed by the insulating grooves 40, 41, which insulate and separate the respective regions, becomes large if the area of the region to be surrounded is large, because the side length necessary for surrounding the region becomes long. Accordingly, when the area of the primary side circuit region is larger than the area of the secondary side circuit region, the relations between the capacitance values of the respective parasitic capacitance can be expressed by follows:

(Capacitance 44 between the primary circuit 2 and the supporting substrate)>(Capacitance 45 between the secondary circuit 3 and the supporting substrate)

(Separating groove parasitic capacitance 46 in the primary circuit 2)>(Separating groove parasitic capacitance 47 in the secondary circuit 3)

Here, in a case when a high voltage is applied to the primary side circuit, and the secondary side circuit is grounded, the potential of the supporting substrate, which may become ideally a half of the applied voltage, becomes higher than a half of the applied voltage, because the capacitance 44 between the primary side circuit and the supporting substrate is larger than the capacitance 45 between the secondary side circuit 45 and the supporting substrate. Accordingly, it becomes necessary to increase the dielectric withstand voltage by increasing the thickness of the buried insulating layer 10 in the SOI substrate 11. Similarly, the separating groove parasitic capacitance 46, 47 differ from each other. Therefore, although ideally the voltage shared by each of the insulating grooves 40, 41 should be a voltage obtained by dividing the applied voltage by the number of the insulating grooves, practically the shared voltage by the insulating groove 41 at the secondary side circuit having a smaller parasitic capacitance becomes higher. Accordingly, if any countermeasure is taken, the dielectric withstand voltage between the circuit region and the supporting substrate and the dielectric withstand voltage of the insulating groove must be set at the highest value among the shared voltage. Various methods of solving these problems will be explained hereinafter with reference to FIG. 9 and FIG. 10.

The first method for solving the problem caused by the unbalance of the parasitic capacitance is to set the areas of the primary side circuit region 2 and the secondary side circuit region 3 indicated in FIG. 9 so as to be equal to each other. In accordance with this method, the capacitance values formed by respective circuit regions becomes equal. Therefore, the thickness of the buried insulating layer in the SOI substrate 11 indicated in FIG. 10 can be to set a value corresponding to a dielectric withstand voltage, which is a half of the necessary dielectric withstand voltage between the primary side circuit and the secondary side circuit. This means that the thickness can be set to the necessary minimum value. Furthermore, the voltage shared by the insulating grooves 6 become uniform, and can be set to a necessary minimum value. Accordingly, the increased cost incurred by increasing the film thickness of the buried insulating layer and increasing the area of the insulating groove region can be suppressed to a minimum. On the other hand, in a case when the area of the primary side circuit region differs significantly from the area of the secondary side circuit region, the area of the chip increases significantly, because the unnecessary circuit region accompanied with equalization of the area becomes large. Accordingly, in case of practical application, it is desirable to compare the advantages and disadvantages resulting from equalization of the area, and to apply the equalization only when the advantages are remarkable.

A second method of solving the problem caused by the unbalance of the parasitic capacitance is to perform countermeasures to solve the unbalance in voltage shared by the parasitic capacitance, based on the premise that the areas of the circuit regions differ from each other. Several countermeasures will be explained with reference to FIG. 9 and FIG. 10.

In order to solve the unbalance in shared voltage of the insulating grooves 40, 41 in FIG. 9, the dielectric withstand voltage of the insulating groove having a smaller area of the circuit region must be enhanced. In accordance with the present embodiment, when the necessary dielectric withstand voltage between the primary side circuit and the secondary side circuit is 3000 V and the dielectric withstand voltage per insulating groove is 100 V, the necessary number of the insulating grooves is ideally 15 per each circuit region, and 30 grooves are necessary. However, because of the difference in the separating groove parasitic capacitance, the voltage shared by one of the insulating grooves 40 surrounding the primary side circuit region 2 of the larger circuit area becomes lower than 100 V the voltage shared by one of the insulating grooves 41 surrounding the secondary side circuit region 3 of smaller circuit area becomes higher than 100 V, and a dielectric breakdown is generated. When the area ratio of the primary side circuit region 2 to the secondary side circuit region 3 is 1:2, the applied voltage is 3000 V, and the peripheral length of the secondary side circuit region is 4 (length 1, width 1), while the peripheral length of the primary side circuit region becomes 6 (for instance, length 1, width 2). At that time, the shared voltage of the insulating groove 40 surrounding the primary side circuit region 2 becomes from 84.3 V to 86.1 V (even in a group of the insulating grooves surrounding the same circuit region, the separating groove near the inner peripheral portion of the circuit region has a smaller parasitic capacitance due to the shorter peripheral length, and accordingly, the shared voltage becomes larger). The shared voltage of the insulating groove 41 surrounding the secondary side circuit region 3 becomes from 113.4 V to 116.5 V, and the shared voltage of the insulating grooves in the secondary side circuit region exceeds the value of the dielectric withstand voltage. Therefore, by increasing the number of the separating grooves in the secondary side circuit region 3 by 5 grooves to provide a total number of 20 grooves, the shared voltage per insulating groove is decreased to 96.5 V, that is, the shared voltage can be suppressed to a value lower than the dielectric withstand voltage. Naturally, it is possible to make all of the insulating grooves have a shared voltage, which does not exceed the dielectric withstand voltage, respectively, by decreasing the number of insulating grooves 40 in the primary side circuit region 2 having the lower shared voltage, while scarcely increasing the total number of the insulating grooves (in this case 30 grooves) necessary between the primary and secondary circuits. For instance, in the previous example, the primary side was 15 grooves, and the secondary side was 20 grooves. Then, 35 grooves were necessary. However, the total number of grooves can be suppressed to 31 by making the primary side 11 grooves due to its lower shared voltage, and making the secondary side 20 grooves. Thereby, the area occupied by the insulating grooves is not decreased, and the cost increase by increasing the chip area can be suppressed.

Next, two methods for solving the unbalance of the shared voltage caused by unbalance of the capacitance between the circuit region and the supporting substrate will be considered.

The first method is to provide a no-electric power supplied region 42 surrounded with the insulating groove 6g in the primary side circuit region 2 having a larger circuit area, as indicated in FIG. 9, so as to decrease the capacitance between the primary side circuit and the supporting substrate.

Hereinafter, a practical method will be explained. Although omitted in FIG. 9, semiconductor elements, such as a MOSFET and the like, are integrated practically in the primary side circuit region 2 and the secondary side circuit region 3. In this case, the potential of the respective semiconductor regions is fixed at the power source voltage, or the ground potential. Therefore, a parasitic capacitance appears between the respective semiconductor regions and the supporting substrate 9 of the SOI substrate. As described previously, a respective parasitic capacitance is increased in proportion to the area occupied by the semiconductor region. Then, in order to decrease the parasitic capacitance, a region 42 which is not connected to any power source voltage nor ground potential, that is, a region that is electrically floating, is formed by the insulating groove 6g in the circuit region. Accordingly, because the floating region is surrounded with the insulating groove 6g, that is, the a no-electrical power supplied region 42 is not connected electrically to the primary side circuit, the parasitic capacitance formed, by the area of the no-electrical power supplied region 42 with the supporting substrate 9 and the buried insulating layer 10 is eliminated from the parasitic capacitance of the original primary circuit region 2. More precisely, the parasitic capacitance based on the no-electric power supplied region 42 and the supporting substrate 9 becomes a negligible small value, because it is connected in series to the minor parasitic capacitance based on-the insulating groove 6g surrounding the no-electric power supplied region 42. Therefore, the capacitance of the no-electric power supplied region 42 versus the supporting substrate can be apparently made zero.

The no-electric power supplied region can be realized by forming regions having no circuit, in which there is no need to supply electric power, such as a portion 43 beneath the bonding pad, or gap of circuits, at a floating potential. As explained above, the capacitance 44 between the primary side circuit region and the supporting substrate can be decreased without changing the circuit area, and can be set at the same value as the capacitance 45 between the secondary side circuit region and the supporting substrate. In accordance with this method, the unbalance in the shared voltage generated when the areas of the regions differ from each other can be solved without increasing the chip area. Therefore, increase in cost incurred by increasing the chip area can be suppressed. Naturally, if the chip has a margin in area, an electric power supplied region surrounded with the insulating groove 6 is newly provided, and the balance in shared voltage may be ensured by connecting electrically the new electric power supplied region to the secondary side circuit region 3 having a smaller circuit area for increasing the capacitance between the secondary side circuit and the supporting substrate.

A second method for solving the unbalance of the shared voltage caused by unbalance of the capacitance between the circuit region and the supporting substrate is to connect an externally fixed capacitance between a ground terminal electrode of a respective circuit region and the supporting substrate outside the semiconductor chip, in order to cause the shared voltage to be determined by the capacitance volume of the externally fixed capacitance. As indicated in FIG. 10, for instance, an external capacitance 48 sufficiently larger than the capacitance between the respective circuit regions and the supporting substrate is externally fixed, the voltage of the supporting substrate is determined by the capacitance ratio of the external capacitance 48. In case of the present method, the capacitance between the circuit region and the supporting substrate can be controlled so as to be wider than the previously indicated method, which provides an electric power supplied region and a no-electric power supplied region. Furthermore, in accordance with the external capacitance, the capacitance between the circuit region and the supporting substrate is increased apparently. Therefore, advantages can be obtained in that cross talking among isolators is decreased and anti-noise performance is improved.

Hitherto, three methods for solving the problem of the unbalance of a shared voltage, which is caused by unbalance of the circuit area, have been explained. However, it is needless to say that, if any of the three methods are combined with each other for performing the necessary countermeasure, it is naturally more effective.

Figure 11:
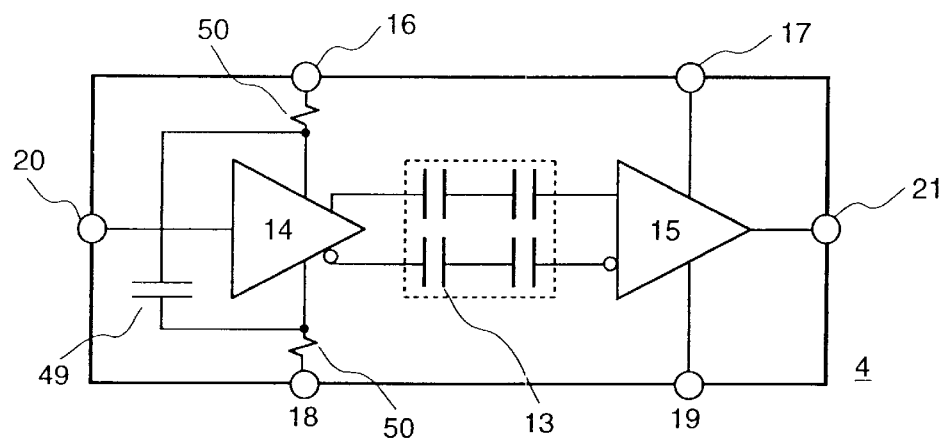
FIG. 11 is a schematic circuit diagram of another embodiment of the isolator incorporated in the semiconductor device according to the present invention.

FIG. 11 schematically illustrates an embodiment of circuit composition of a capacitive isolator, which is incorporated in the semiconductor device according to the present invention. The isolator 4 is composed of a driver portion 14, a capacitor 13, and a receiver portion 15. Because the driver portion 14 and the receiver portion 15 must be insulated electrically from each other, each of the driver portion 14 and the receiver portion 15 is provided with power source terminals 15, 17, 18, 19 for connecting to an independent power source, respectively. In accordance with the present embodiment, the capacitance 49 is connected to a portion between the power source and the grounding near the driver portion 14 of the isolator. The driver portion 14 is substantially composed of an inverter, because a complementary signal is transmitted. Therefore, a large current peak is generated during the first transition and the last transition of the transmitting signal. The current peak becomes a noise source not only of the driver portion 14, but also of the external circuit. However, a filter composed of the resistance 50 of the power source wiring and the capacitance 49 is formed by connecting the capacitance 49 to the portion between the power source and the grounding near the driver portion 14, and the capacitor 49 operates as a battery. Therefore, an effect to decrease the peak current at the power pad portion based on a current waveform, which is generated by a transmitting amplifier of the isolator, can be obtained. Accordingly, because the noise at the pad portion is decreased, and the influence of the noise on other circuits is decreased, it is effective for improving the anti-noise performance. Furthermore, in accordance with forming the capacitance of the present embodiment in the adjusting circuit region for solving the unbalance of the circuit region as explained reference to FIG. 10, balancing the shared voltage and decreasing the noise can be made compatible.

Figure 12:
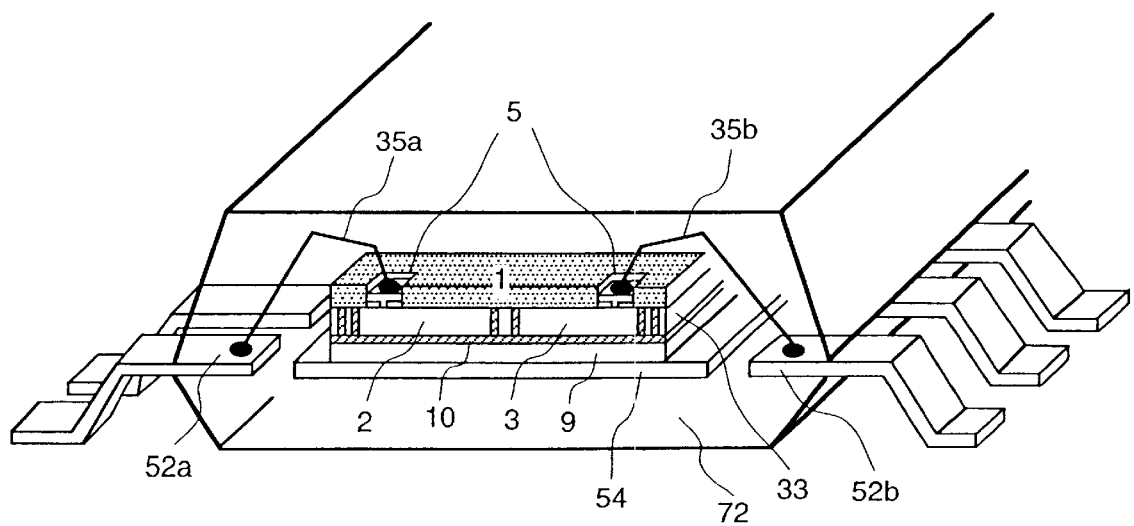
FIG. 12 is a perspective view showing a state of mounting in an embodiment of the semiconductor device according to the present invention.

FIG. 12 is a partial perspective view (partly, a cross section) indicating the mounting state in an embodiment of the semiconductor device 1 according to the present invention, as indicated in FIG. 1, FIG. 7, and FIG. 9. The semiconductor device is molded in a SOP (Small Outline Package) type package, wherein the semiconductor device is exaggerated for facilitating its illustration, and its cross section is indicated schematically. The semiconductor chip 1 of the present invention is mounted onto the die pad 54 of a lead frame. The primary side circuit region 2 of the semiconductor device is connected electrically to the outside of the semiconductor device by connecting the bonding pad 5 to the lead 52a with bonding wire 35a made of aluminum, gold, or the like. Similarly, the secondary side circuit region 3 of the semiconductor device connected electrically to the outside of the semiconductor device by connecting the bonding pad 5 to the lead 52b with bonding wire 35b. The semiconductor device according to the present embodiment, which is connected electrically to the lead 52 with the bonding wire 35, is molded with molding material 72, such as a resin and the like. Here, a high voltage is applied between the lead 52a connected to the primary side circuit region 2 and the lead 52b connected to the secondary side circuit region 3. Inside the semiconductor device 1, these leads are insulated and separated electrically by the insulating body such as the buried insulating layer 10. Because the supporting substrate 9 of the semiconductor device has a potential of approximately a half of the applied voltage, the potential of the die pad is also approximately a half of the applied voltage. Accordingly, if a voltage is applied to the primary side lead 52a and the secondary side lead 52b, potential differences are generated in various regions, such as between the primary side circuit region 2-the secondary side circuit region 3 of the semiconductor device 1, between the circuit region the supporting substrate 9, between the primary side bonding wire 35a—the secondary side bonding wire 35b, between the bonding wire 35—the supporting substrate 9, between the die pad 54-the lead 52, and others, as well as between the lead 52a and the lead 52b. However, the dielectric withstand voltage can be ensured as a whole by performing a treatment for insulation outside the semiconductor, in addition to the insulation-separation at the inner portion of the semiconductor device, as explained hitherto.

In FIG. 12, the bonding wire 35 of the primary side and the secondary side are withdrawn in a direction opposite each other. By forming the structure as described above, the insulating distance is kept even outside the semiconductor device. Naturally, it is needless to say that the insulating distance is set so as to ensure that the dielectric withstand voltage will be higher than the dielectric withstand voltage of the isolator designated by the specification both inside and outside the molded body.

Next, the mounting state of the semiconductor device according to the present invention will be explained hereinafter with reference to drawings from FIG. 13 to FIG. 16.

FIG. 13(a) illustrates an embodiment of the semiconductor device according to the present invention shown in FIG. 1, FIG. 7 and FIG. 9, wherein the semi conductor device is molded..into an external package. The semiconductor chip 1 including the isolator arranged on a lead frame is connected to the leads 52a, 52b via the bonding pads of the semiconductor device by the bonding wire 51 made of aluminum, gold, or the like. In order to establish the insulating distance, the leads 52a, 52b are provided respectively at each of the boding pad side of the primary side circuit region 2 side and the bonding pad side of the secondary side circuit region 3 at outside the semiconductor chip 1. The leads 52a, 52b are respectively connected electrically to each of the boding pad of the primary side circuit region 2 and the bonding pad of the secondary side circuit region 3.

The space distance 53 between the leads 52a and 52 is determined to be a distance which can prevent the space between the leads 52a and 52b from causing dielectric breakdown. Practically, the distance is determined to be at least the minimum space distance designated in view of the dielectric withstand voltage performance. Accordingly, the SOP type package is desirable, because it is capable of readily setting the distance between the lead 52a at the primary side and the lead 52b at the secondary side. Naturally, if the minimum space distance designated by the product specification is satisfied, various packages, such as a QFP (Quad Flat Package) and the like, other than the SOP type package, may be usable. In accordance with the present embodiment, the leads 52a, 52b are arranged with a sufficient insulating distance by arranging the leads 52a and 52b, respectively, along each of the two facing sides of a rectangular shape outside the peripheral portion of the rectangular semiconductor chip 1, selecting the facing two sides, along which the bonding pads are arranged, and extending the leads from the periphery of the semiconductor chip outwards in a direction perpendicular to the facing two sides.

Moreover, caution is necessary on the inner leads (the portion where the leads are molded) where the semiconductor device is molded. As explained previously, when a high voltage is applied between the primary side circuit region and the secondary side circuit region, the potential of the supporting substrate becomes approximately a half of the potential of the primary side circuit region and the secondary side circuit region. Accordingly, the distance 55 between the die pad 54 holding the semiconductor chip and the inner lead connected electrically to the primary side circuit region, or the secondary side circuit region, is set as a distance necessary for withstanding the voltage. In this case, the minimum distance between the die pad 54 and the inner lead can be determined from the electric characteristics of the molding material and the specification of the dielectric withstand voltage. In this embodiment, the minimum distance is 0.35 mm. Similarly, the distance 57 between the lead 56 withdrawn from the die pad 54 and the outer lead 52 connected electrically to the primary side circuit region, or the secondary side circuit region, is set as a necessary insulating distance. In this case, the distance between the die pad and the outer lead can be determined based on the dielectric withstand voltage defined by the minimum space distance.

In accordance with the present composition, the semiconductor device composed of a monolithic composition according to the present invention is significantly effective in lowering the price, because the semiconductor device can be provided in a type of cheap and general use package such as SOP type, or QFP type, without using an expensive and exclusive package, multi-chip module, and the like.

FIG. 14 illustrates another example of the semiconductor device shown in FIG. 1, FIG. 7 and FIG. 9, wherein the semiconductor device is molded into a package. In FIG. 14, details of the semiconductor chip and wiring such as bonding wire and the like are omitted. In accordance with the present embodiment, the lead 56 withdrawn from the die pad connected electrically to the supporting substrate portion of the semiconductor device 1, and the lead 52 connected to the bonding pads of the primary side circuit and the secondary side circuit are arranged so as to interpose an unused lead 58, which is not connected to the bonding pad. Accordingly, even with the package having a narrow pitch lead, such that the necessary space distance can not be taken, it becomes possible to make the primary side circuit, the supporting substrate having an approximately intermediate potential between the primary side and the secondary side, and the secondary circuit have high insulating characteristics relative to each other and to decrease its size further.

Figure 15:
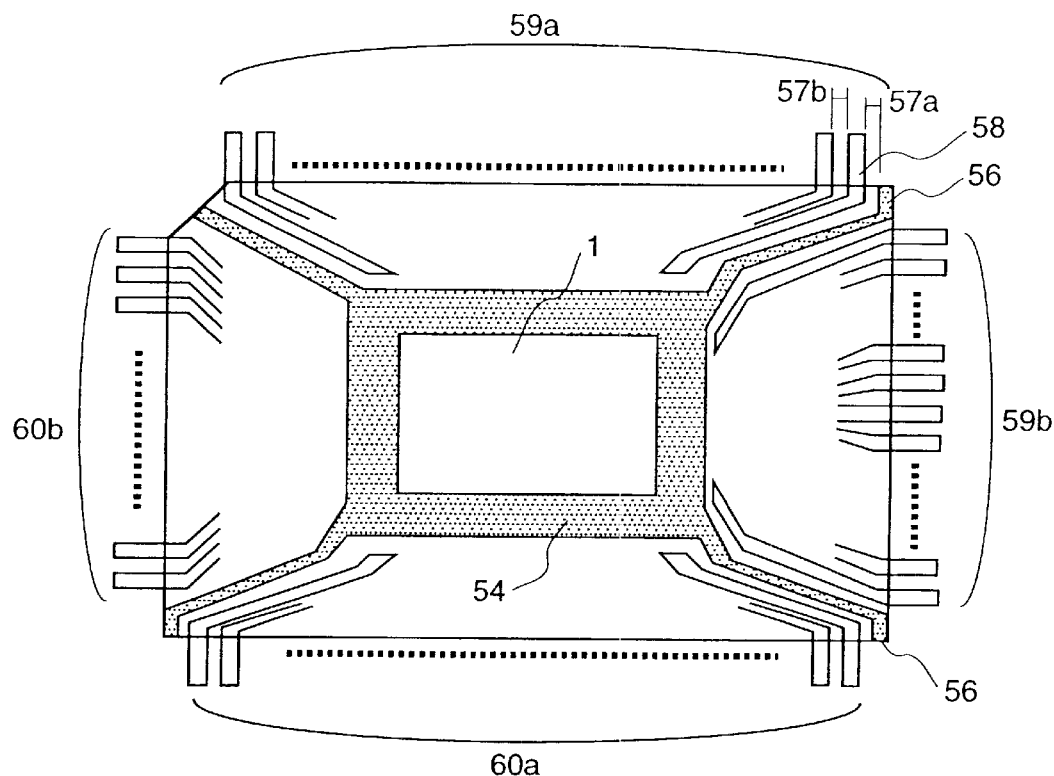
FIG. 15 is a plan view of one other embodiment of the semiconductor device according to the present invention for assembly into a package.

FIG. 15 illustrates another example of the semiconductor device shown in FIG. 1, FIG. 7 and FIG. 9, wherein the semiconductor device is molded into a package. In FIG. 15, details of the semiconductor chip and wiring such as the bonding wire and the like are omitted. The present embodiment is an example of molding the semiconductor device using a QFP type package. The leads connected to the terminal electrodes of the primary side circuit are gathered at the upper side 59a and right side 59b of the drawing, and the leads connected to the terminal electrodes of the secondary side circuit are gathered at the lower side 60a and the left side 60b of the drawing. In the case of the present embodiment, the distance between the lead 56 withdrawn from the die pad 54 and the lead of the primary side circuit and the secondary side circuit is set as the necessary insulating distance. In accordance with the present embodiment, it is needless to say that the method for establishing the necessary space distance by providing an unused lead as explained with references to FIG. 14 is also effective. For instance, the distance 57a between the lead 58 at the most right side in the lead group 59a connected to the primary side circuit region and the lead 56 withdrawn from the die pad 54 must be a space distance which can prevent the leads from causing dielectric breakdown with a voltage lower than the dielectric withstand voltage of the semiconductor device. At that time, when the lead pitch of the package is smaller than the necessary insulating and separating distance, the distance necessary for insulation and separation can be obtained by providing the lead 58 at the most right side so that it is unconnected to the primary side circuit region, because the distance between the lead group 59a connected to the primary side circuit and the lead 56 withdrawn from the die pad can be regarded as the sum of the distance 57b between the primary circuit side lead group 59a and the unconnected lead 58n and the distance 57a between the unconnected lead 58 and the lead 56 from the die pad. As explained above, in the case of the present embodiment, it is necessary to pay attention so that the distance between the outer leads withdrawn to the outside of the package is set to at least the necessary insulating and separation distance from each other. However, in comparison with the semiconductor device using a SOP type package, the present embodiment is more advantageous in integration, because the number of usable leads versus the occupied area of the package can be made larger.

Figure 16:
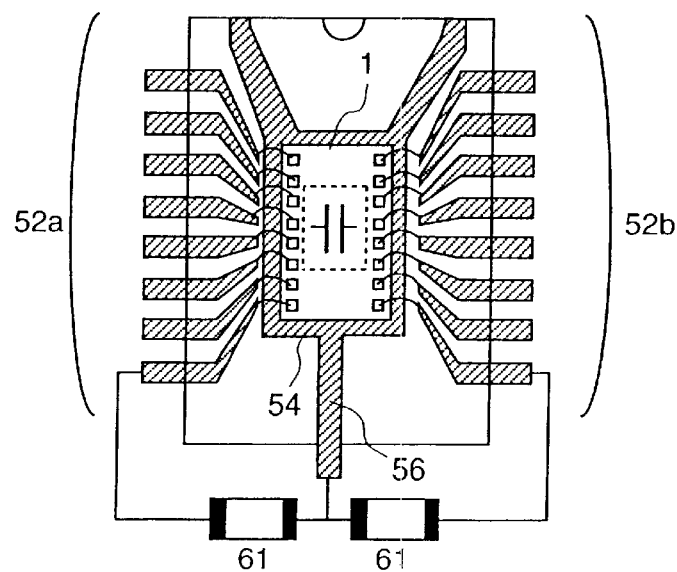
FIG. 16 is a plan view of an embodiment indicating a shape of the lead frame according to the present invention.

FIG. 16 illustrates another example of the semiconductor device shown in FIG. 1, FIG. 7 and FIG. 9, wherein the semiconductor device is molded into a package. In FIG. 16, details of the semiconductor chip are omitted. In accordance with the present embodiment, the lead 56 is withdrawn from the die pad mounting the semiconductor device, and a high dielectric withstand voltage chip condenser 61 is connected, respectively, between the grounding terminal electrode of the primary side circuit and the lead 56, and between the grounding terminal electrode of the secondary side circuit and the lead 56. By withdrawing the lead 56 from the die pad 53 in a direction different from the lead group of the primary side, or the lead group of the secondary side as in the present embodiment, it becomes possible to realize readily the necessary insulation and separation between the primary side circuit and the die pad, and between the secondary side circuit and the die pad. Furthermore, in accordance with the present embodiment, the mounting of the external capacitance as explained with reference to FIG. 9 and FIG. 10 is facilitated.

The above embodiments can be combined appropriately. In the embodiments explained above, examples involve the use of SOP type packages and QFP type packages. However, it is needless to say that the invention can be applied to the case when the semiconductor device of the present invention is mounted with TCP (Tape Carrier Package) type package and by potting. An interval between the communication circuit and the terminal devices can be insulated and separated by the semiconductor device in the respective embodiments using a modem circuit connected between the communication circuit and the terminal devices for modulating-demodulating signals transmitted between the communication circuit and the terminal devices. When the semiconductor device according to the above embodiments is used for medical and instrumentation apparatuses, various kinds sensor portions can be insulated and separated from the signal processing circuits.

Figure 17:
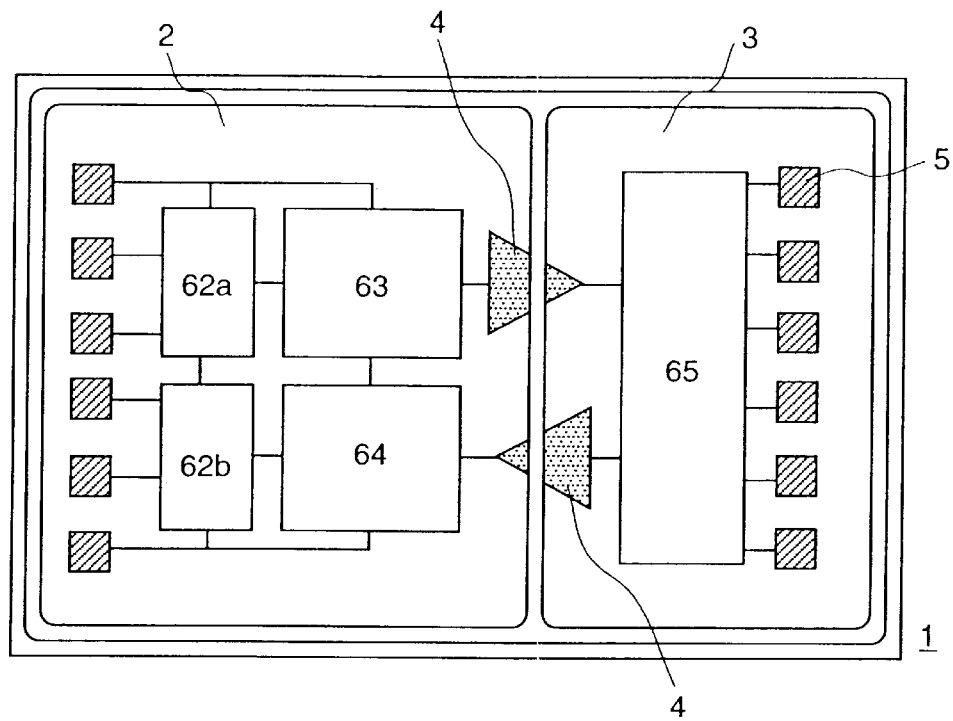
FIG. 17 is a schematic diagram of an embodiment, wherein the semiconductor device according to the present invention is applied to a modem AFE.

FIG. 17 is an example of an analog front end LSI for a modem in accordance with the present invention. In the case of the present embodiment, the primary side circuit region 2 is regarded as a telephone line side circuit (Line side circuit) and the secondary side circuit region 3 is regarded as terminal side circuit (Host side circuit) The interval between the line side circuit and the host side circuit requires an insulation of at least 3000 V. In accordance with the present embodiment, the dielectric withstand voltage of several thousands of volts can be obtained. The isolator 4 operates to transmit signals from the line side to the host side, or from the host side to the line side, while maintaining the insulation between the, line side circuit and the host side circuit. Circuits of a filter, amplifier 62, A/D (analog to Digital) converter 63, and D/A (Digital to analog) converter 64 are formed in the line side circuit, and various kinds of digital filters and a DSP (Digital Signal Processor) 65 are formed in the host side circuit. As the isolator 4, a capacitive isolator comprising a high dielectric withstand voltage capacitor for insulation and a transmitting and receiving amplifier, is used in view of readiness in manufacturing and lowering of the price. The bonding pads 5 are arranged so that the minimum space distance 7 satisfies the distance for insulation and coordination designated by the safety standard. Furthermore, if such a modem circuit is incorporated into the terminal device of personal computers and the like, an internal circuit of the terminal device, such as a logical processing circuit and the like, can be insulated and separated from the communication line. As explained above, if the semiconductor device according to the present invention is applied to a modem circuit, or the terminal device is incorporated with the modem circuit, these circuits and devices can be decreased in size.

Figure 18:
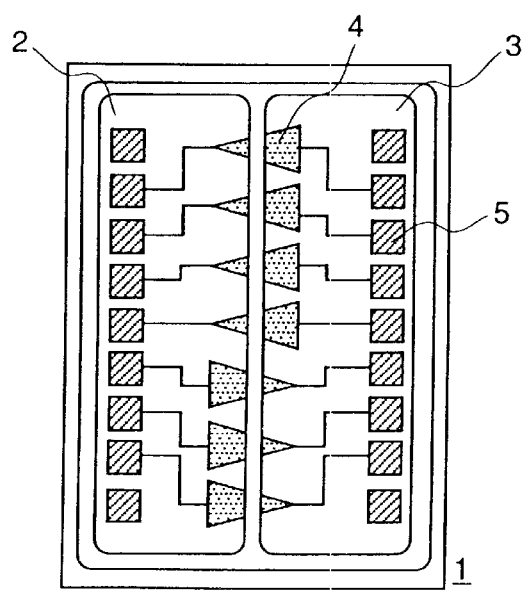
FIG. 18 is a schematic diagram of an embodiment, wherein the semiconductor device according to the present invention is applied to an isolator array.

FIG. 18 illustrates a further example of the present invention, wherein the isolators 4 are integrated for specifically insulating and separating the primary side circuit 2 from the secondary side circuit 3, and for transmitting signals. In comparison with an isolator using a conventional using photodiode, the isolator of the present embodiment can be manufactured with a lower cost, because the isolator can be formed by exactly the same process as the manufacturing process of conventional semiconductor device. Furthermore, the isolators can be arranged with the minimum separating distance for preventing dielectric breakdown, because a large number of isolators can be integrated onto the same semiconductor chip. Therefore, a decrease in cost by decreasing the chip area and a decrease in the number of components, decreasing its size, and an increase in its channel to multi-channels become possible.

Figure 19:
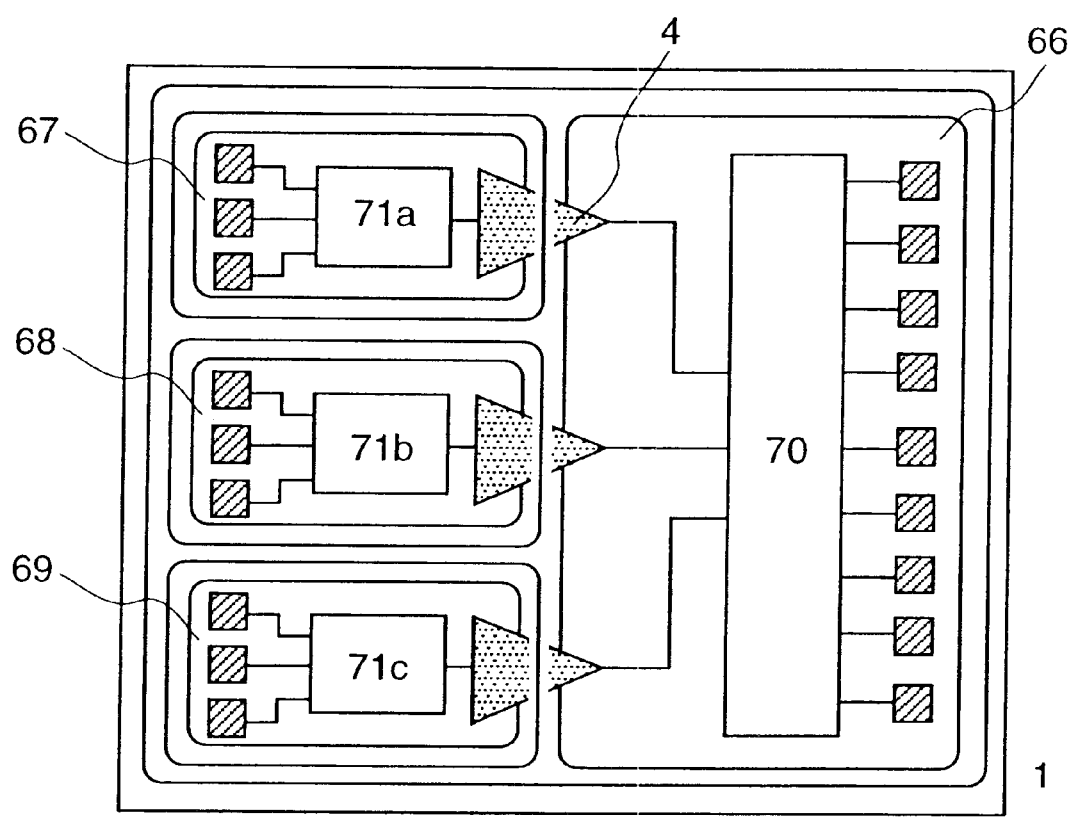
FIG. 19 is a schematic diagram of one other embodiment, in which the semiconductor device according to the present invention is applied.

FIG. 19 illustrates another embodiment according to the present invention. The embodiments explained hitherto are examples using two insulated and separated circuit regions, but it is possible to make plural insulated and separated circuit regions exist. In the present embodiment, a control circuit 70 including the receiver circuit portion of the isolator is arranged in a common circuit region 66, and control circuits including the driver circuit portion 71 of the isolator are composed respectively of independent circuit regions from 67 to 69. In accordance with the composition described above, electric insulation and separation between the driver circuit and the receiver circuit, and between respective driver circuits can be realized, and signal transmittance from respectively insulated and separated circuits becomes possible. By using the present embodiment, the integration of various information from mutually independent electric apparatuses becomes possible while maintaining the high insulation and separation. Furthermore, because the manufacturing process is the same as the manufacturing process of the isolator explained hitherto, it is possible to realize the embodiment in small size and with a low price.

In accordance with the present invention, a small size, or low price semiconductor device having a high insulating performance can be realized.

What is claimed is:

1. A semiconductor device wherein a semiconductor chip comprises:

a first circuit region, plural first terminal electrodes connected to said first circuit region, a second circuit region insulated and separated electrically from said first circuit region, plural second terminal electrodes connected to said second circuit region, and transmitting means for separating electrically said plural first terminal electrodes and said plural second terminal electrodes, and transmitting signals between said plural first terminal electrodes and said plural second terminal electrodes wherein said transmitting means is incorporated with a capacitor, which uses an insulating groove formed in a semiconductor region of said semiconductor chip as a dielectric.

2. A semiconductor device wherein a semiconductor chip comprises:

a first circuit region, plural first terminal electrodes connected to said first circuit region, a second circuit region insulated and separated electrically from said first circuit region, plural second terminal electrodes connected to said second circuit region, and transmitting means for separating electrically said plural first terminal electrodes and said plural second terminal electrodes, and transmitting signals between said plural first terminal electrodes and said plural second terminal electrodes wherein said transmitting means is incorporated with a flat plate type capacitor, which uses an interlayer insulation film on the semiconductor chip as a dielectric.

3. A semiconductor device wherein a semiconductor chip comprises:

a first circuit region, plural first terminal electrodes connected to said first circuit region, a second circuit region insulated and separated electrically from said first circuit region, plural second terminal electrodes connected to said second circuit region, and transmitting means for separating electrically said plural first terminal electrodes and said plural second terminal electrodes, and transmitting signals between said plural first terminal electrodes and said plural second terminal electrodes wherein when the area occupied by said first circuit region differs from the area occupied by said second circuit region, the dielectric withstand voltage in the circuit region occupying the smaller area is made higher than that in the other circuit region.

4. A semiconductor device as claimed in claim 3 wherein, the circuit region is insulated and separated by insulating grooves, and the dielectric withstand voltage is made higher by increasing the number of the grooves, which insulate and separate the circuit region occupying the smaller area.

5. A semiconductor device wherein a semiconductor chip comprises:

a first circuit region, plural first terminal electrodes connected to said first circuit region, a second circuit region insulated and separated electrically from said first circuit region, plural second terminal electrodes connected to said second circuit region, and transmitting means for separating electrically said plural first terminal electrodes and said plural second terminal electrodes, and transmitting signals between said plural first terminal electrodes and said plural second terminal electrodes wherein when the area occupied by said second circuit differs from the area occupied by said second circuit region, a region, which is not connected electrically to any other region by insulating and separating means, is set in the circuit region occupying the larger area.

6. A semiconductor device wherein a semiconductor chip comprises:

a first circuit region, plural first terminal electrodes connected to said first circuit region, a second circuit region insulated and separated electrically from said first circuit region, plural second terminal electrodes connected to said second circuit region, and transmitting means for separating electrically said plural first terminal electrodes and said plural second terminal electrodes, and transmitting signals between said plural first terminal electrodes and said plural second terminal electrodes wherein when the area occupied by said first circuit region differs from the area occupied by said second circuit region, a region, which is connected electrically to the circuit region occupying the smaller area, is set by insulating and separating means outside the circuit region occupying the smaller area.

7. A semiconductor device wherein a semiconductor chip comprises:

a first circuit region, plural first terminal electrodes connected to said first circuit region, a second circuit region insulated and separated electrically from said first circuit region, plural second terminal electrodes connected to said second circuit region, and transmitting means for separating electrically said plural first terminal electrodes and said plural second terminal electrodes, and transmitting signals between said plural first terminal electrodes and said plural second terminal electrodes wherein when the area occupied by said first circuit region differs from the area occupied by said second circuit region, a region, which is not connected electrically to any other region by insulating and separating means, is set in the circuit region occupying the larger area, and a region, which is connected electrically to the circuit region occupying the smaller area, is set by insulating and separating means outside the circuit region occupying the smaller area.

8. A semiconductor device wherein a semiconductor chip comprises:

a first circuit region, plural first terminal electrodes connected to said first circuit region, a second circuit region insulated and separated electrically from said first circuit region, plural second terminal electrodes connected to said second circuit region, and transmitting means for separating electrically said plural first terminal electrodes and said plural second terminal electrodes, and transmitting signals between said plural first terminal electrodes and said plural second terminal electrodes wherein when the area occupied by said first circuit region differs from the area occupied by said second circuit region, a capacitance is connected between the circuit region and a portion other than the circuit region outside said semiconductor device.

9. A semiconductor device wherein a semiconductor chip comprises:

a first circuit region, plural first terminal electrodes connected to said first circuit region, a second circuit region insulated and separated electrically from said first circuit region, plural second terminal electrodes connected to said second circuit region, and transmitting means for separating electrically said plural first terminal electrodes and said plural second terminal electrodes, and transmitting signals between said plural first terminal electrodes and said plural second terminal electrodes wherein a capacitance is connected between the power source near said transmitting means and ground.

10. A semiconductor device as claimed in claim 9 wherein, an area occupied by said capacitance is set to a value, which makes the area occupied by respective circuit regions equal to each other.

* * * * *